(12) United States Patent
Zhang

(10) Patent No.: US 8,159,189 B2
(45) Date of Patent: Apr. 17, 2012

(54) BATTERY STATE OF HEALTH MONITORING SYSTEM AND METHOD

(75) Inventor: Xiaodong Zhang, Mason, OH (US)

(73) Assignee: GM Global Technology Operations LLC, Detroit, MI (US)

( * ) Notice: Subject to any disclaimer, the term of this patent is extended or adjusted under 35 U.S.C. 154(b) by 1166 days.

(21) Appl. No.: 11/951,400

(22) Filed: Dec. 6, 2007

(65) Prior Publication Data

US 2009/0146664 A1    Jun. 11, 2009

(51) Int. Cl.
H02J 7/00 (2006.01)
G01R 31/36 (2006.01)
G01R 19/00 (2006.01)
(52) U.S. Cl. .............. 320/136; 702/63; 702/64
(58) Field of Classification Search ........... 320/132, 320/134, 136; 702/58, 63, 64, 65; 324/429
See application file for complete search history.

(56) References Cited

U.S. PATENT DOCUMENTS

| 4,731,601 A | 3/1988 | Nowakowski et al. |
| 5,896,023 A * | 4/1999 | Richter ............... 320/104 |
| 6,424,157 B1 * | 7/2002 | Gollomp et al. ....... 324/430 |
| 6,472,875 B1 | 10/2002 | Meyer |

OTHER PUBLICATIONS

Meissner et al.,"Vehicle electric power systems are under change! Implications for design, monitoring and management of automotive batteries", Journal of Power Sources 95 (2001) 13-23.
Blanke et al.,"Impedance measurements on lead—acid batteries for state-of-charge, state-of-health and cranking capability prognosis in electric and hybrid electric vehicles", Journal of Power Sources 144 (2005) 418-425.

* cited by examiner

*Primary Examiner* — Richard V Muralidar

(57) ABSTRACT

A state-of-health monitoring and prognosis method and system for a battery includes a signal preprocessing module for monitoring battery terminal voltage and current and extracting a portion of the battery terminal voltage and current corresponding to an engine cranking event. Battery voltage loss that occurs during said engine cranking event is estimated from the extracted portion of battery terminal voltage and current by a voltage loss estimation module. The estimated battery voltage loss is compared with a predetermined voltage loss threshold to determine battery state-of-health by a state-of-health evaluation module.

18 Claims, 5 Drawing Sheets

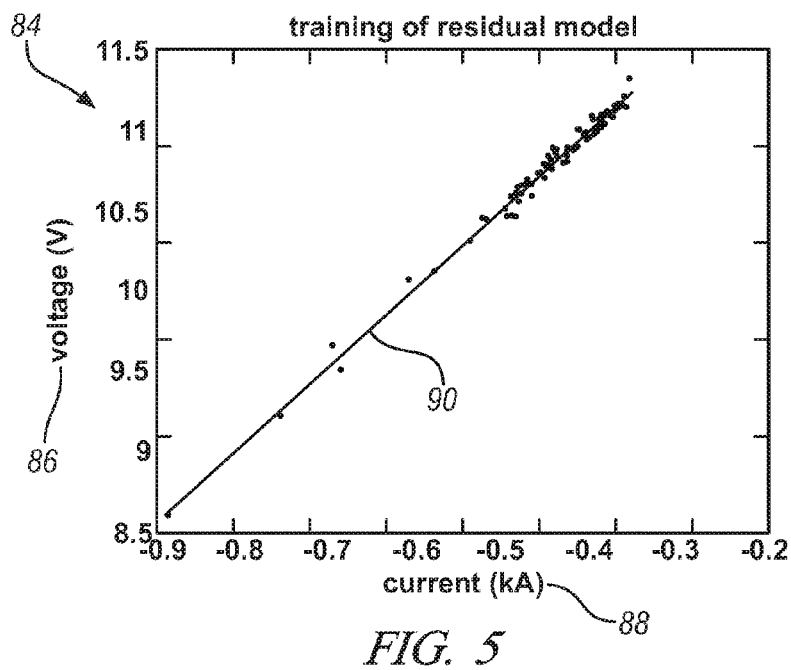
FIG. 5
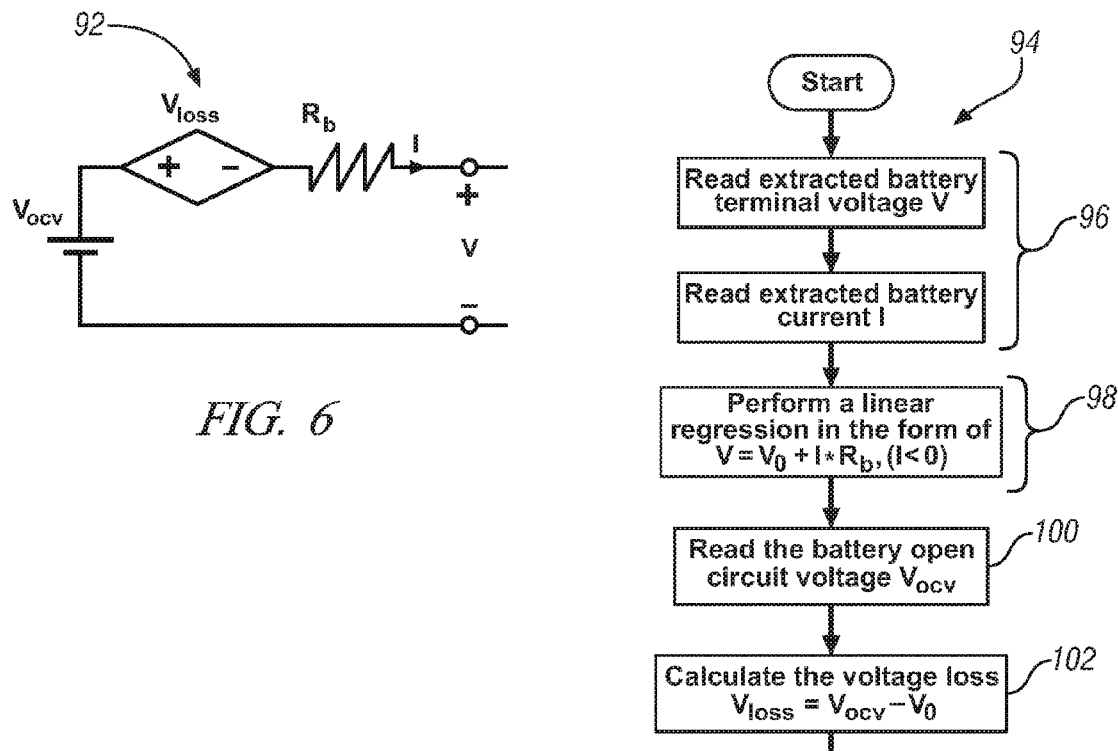
FIG. 6
FIG. 7

BATTERY STATE OF HEALTH MONITORING SYSTEM AND METHOD

TECHNICAL FIELD

This disclosure is related to vehicle battery monitoring systems.

BACKGROUND

The number of electrical devices in modern vehicles has been rapidly increasing. The vehicle electric power system is required to supply sufficient power to all such devices, including safety related systems and convenience and entertainment systems. An electric power management system balances the power demanded and the power provided to ensure the vehicle's start-up ability. An accurate and reliable knowledge of the battery state is therefore desirable for effective electric power management.

SUMMARY

A state-of-health monitoring and prognosis method for a battery includes monitoring battery terminal voltage and current and extracting a portion of the battery terminal voltage and current corresponding to an engine cranking event. Battery voltage loss that occurs during said engine cranking event is estimated from the extracted portion of battery terminal voltage and current. The estimated battery voltage loss is compared with a predetermined voltage loss threshold to determine battery state-of-health.

BRIEF DESCRIPTION OF THE DRAWINGS

One or more embodiments will now be described, by way of example, with reference to the accompanying drawings, in which:

FIG. 5 graphically illustrates the linear relationship between battery current and terminal voltage during engine cranking in accordance with the present disclosure;

FIG. 6 is a diagram illustrating a battery model with voltage loss defining the battery dynamics during engine cranking in accordance with the present disclosure;

FIG. 7 is a flowchart illustrating voltage loss estimation in accordance with the present disclosure;

DETAILED DESCRIPTION

Figure 1:
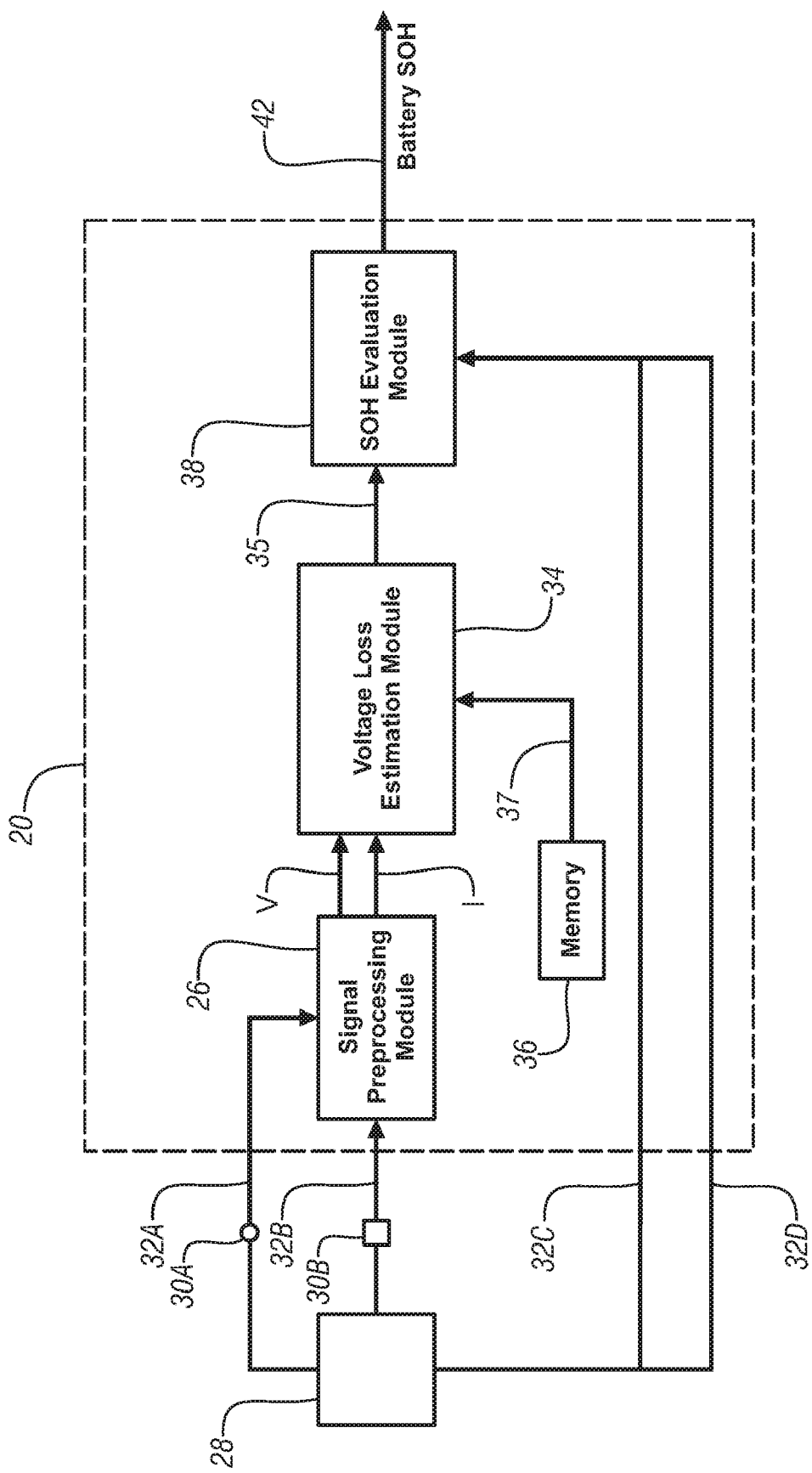
FIG. 1 is a schematic diagram for battery state-of-health monitoring and prognosis in accordance with the present disclosure.

Referring now to the drawings, wherein the showings are for the purpose of illustrating certain exemplary embodiments only and not for the purpose of limiting the same, a battery state-of-health (SOH) monitoring system and method in accordance with the present disclosure uses voltage loss during cranking to provide SOH information. The battery SOH monitoring system and method disclosed herein includes a battery model defining battery dynamics during engine cranking. More particularly, the battery SOH monitoring system and method uses voltage loss during cranking and a battery model to monitor SOH to provide advanced warning of battery end of life, to characterize the remaining useful life (RUL), and to provide such information to a user of the SOH monitoring system and method.

FIG. 1 illustrates a schematic diagram of a battery SOH monitoring system 20 using voltage loss during engine cranking in accordance with the present disclosure. The system 20 includes a plurality of modules that cooperate to process input signals received from a battery on-board a vehicle and to evaluate the received input signals to determine the battery's SOH. As used herein the term "module" or "modules" includes one or more units capable of processing or evaluating signals input into or stored within the battery SOH monitoring system 20. Each module may be a stand-alone unit or a plurality of units comprising hardware or software or a combination thereof.

More particularly, in an embodiment in accordance with the disclosure, the battery SOH monitoring system 20 resides in a vehicle environment and includes a signal preprocessing module 26 adapted to receive a plurality of inputs from a plurality of sensors 30A, 30B that sense parameters of at least one battery 28. A battery voltage sensor 30A monitors battery 28 terminal voltage and provides a battery terminal voltage signal 32A to signal preprocessing module 26. Similarly, a battery current sensor 30B monitors battery 28 current and provides a battery current signal 32B to signal preprocessing module 26. Battery temperature signals 32C, and battery state-of-charge signals 32D are also input to battery SOH monitoring system 20 as further described herein below with respect to an SOH evaluation module 38. Signal preprocessing module 26 is adapted to provide an extracted battery voltage signal (V) and an extracted battery current signal (I) corresponding to the engine cranking process to a voltage loss estimation module 34. The voltage loss estimation module 34 additionally is adapted to receive a battery open-circuit-voltage signal 37 from a memory device 36 storing battery open-circuit-voltage. The voltage loss estimation module 34 is further adapted to provide a voltage loss output signal 35 to SOH evaluation module 38. The SOH evaluation module 38 further receives a battery temperature signal 32C provided, for example, from a battery temperature sensor (not shown) or inferred from existing vehicle information such as engine coolant temperature. A battery state-of-charge signal 32D is also provided to the SOH evaluation module 38 for example from correlated battery open circuit voltage and battery SOC data. The SOH evaluation module is adapted to obtain a battery SOH and provide a battery SOH indicator signal 42.

Figure 2:
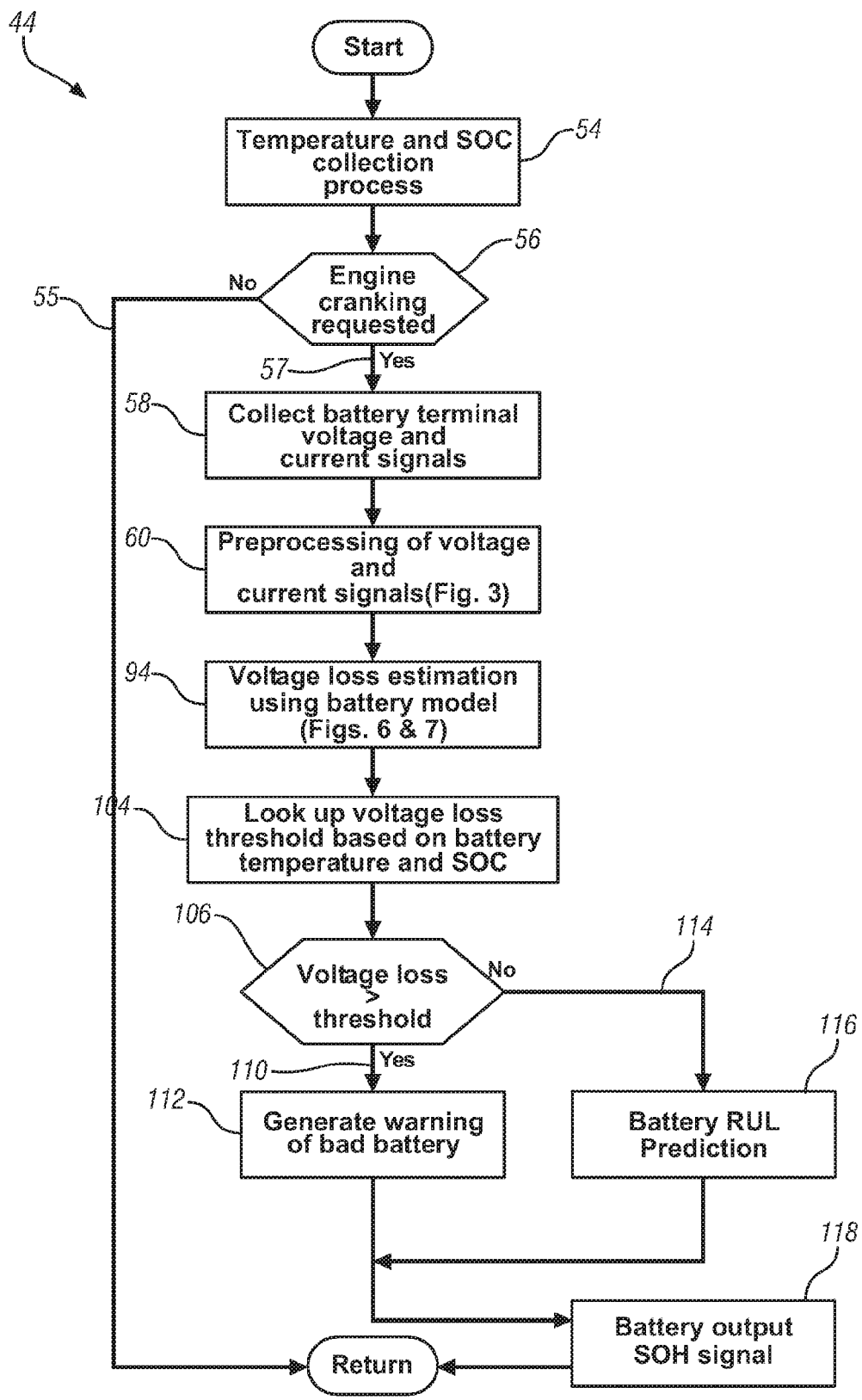
FIG. 2 is a flowchart illustrating a computational procedure for battery state-of-health monitoring and prognosis in accordance with the present disclosure.

FIG. 2 is a flowchart depicting a routine (44) for determining SOH of a battery based on voltage loss during engine cranking. Initially, a temperature and SOC collection process (54) is performed by the signal preprocessing module 26 to collect data associated with battery temperature and battery SOC signals prior to an engine-cranking event.

Next, the signal preprocessing module 26 determines if an engine cranking request is present (56). If no cranking request is present (55), the routine is exited. If a cranking request is present (57), the signal preprocessing module 26 performs a battery terminal voltage and battery current collection process (58) with the battery voltage sensor 30A and the battery current sensor 30B.

Figure 3:
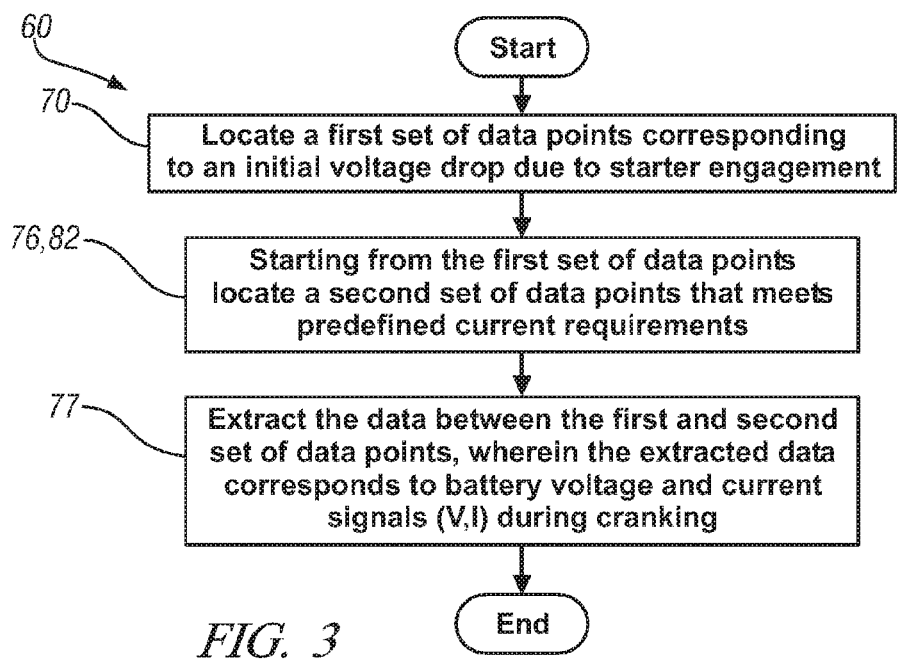
FIG. 3 is a flowchart illustrating a procedure of preprocessing battery current and terminal voltage signals in accordance with the present disclosure.

The signal preprocessing module 26 next performs a preprocessing process of the battery terminal voltage signal 32A and battery current signal 32B (60) as set forth in further detail with additional reference to FIG. 3. Briefly, FIG. 3 depicts the preprocessing process (60) of FIG. 2 used to extract selected portions of the battery terminal voltage signal 32A and the battery current signal 32B that correspond particularly to engine cranking. With additional reference to FIG. 4, exemplary battery current and battery terminal voltage signals, 62 and 64 respectively, extracted during engine cranking are illustrated.

Figure 4:
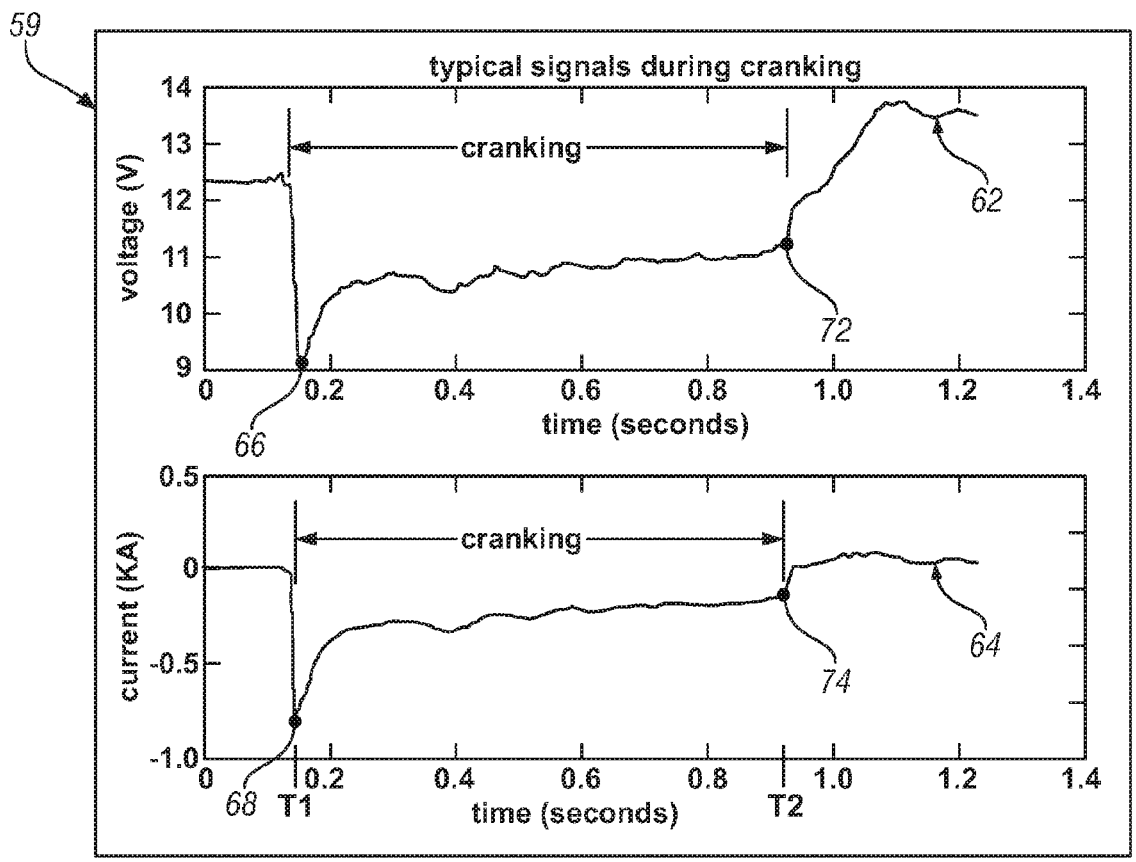
FIG. 4 gives an example of typical battery current and terminal voltage signals related to engine cranking in accordance with the present disclosure.

With continued reference to FIGS. 2-4, a portion of the battery terminal voltage signal 32A and battery current signal 32B are extracted (77) using the signal preprocessing process (60). More particularly, the extracted portions of the battery terminal voltage signal 32A and battery current signal 32B characterize battery signals generated during engine cranking occurring during a time interval defined by instant T1 and instant T2. A first set of data points 66, 68 corresponding to an initial voltage drop due to starter engagement at instant T1 is identified (70).

In an embodiment in accordance with the disclosure, a second set of data points 72, 74 corresponding to a first occurrence of a current I exceeding a predefined threshold after instant T1, at instant T2, is identified (76). In one embodiment in accordance with the disclosure, the predefined threshold is −100 A. In another embodiment in accordance with the disclosure, a battery voltage signal threshold can be used to define instant T2. In another embodiment in accordance with the disclosure, only a part of the voltage and current signals in [T1, T2] are considered. In an embodiment in accordance with the disclosure, the signals corresponding to −300 A<I<−100 A may be used.

A graphical illustration 84 of extracted cranking data of a battery is shown in FIG. 5, where the battery terminal voltage defines the y-axis 86 and is plotted versus battery current defining the x-axis 88. This cranking data illustrates a linear relationship between the battery terminal voltage and the battery current occurring during an engine cranking event. The cranking data of the battery form a strong linear relationship as depicted as line 90 in FIG. 5.

The voltage loss estimation module 34 includes a battery model 92, illustrated in FIG. 6, determining battery dynamics. The battery dynamics modeled in FIG. 6 are given by Equation (1):

$$V = V_{ocv} - V_{loss} + I*R_b, (I<0 \text{ for discharge}), \quad (1)$$

wherein V is the battery terminal voltage and I is the battery current, each measured during the battery terminal voltage and battery current collection process (58), $V_{ocv}$ is the battery open-circuit-voltage obtained before engine cranking, $V_{loss}$ is the battery voltage loss during cranking as determined by the battery voltage loss module 34, and Rb is battery internal resistance as determined by the battery voltage loss module 34.

With additional reference now to FIG. 7, the voltage loss estimation module 34 estimates voltage loss (94) using battery model 92 from FIG. 6. The voltage loss estimation module 34 first reads the extracted cranking data (96), more specifically the extracted engine cranking voltage (V) and the extracted engine cranking current (I). A linear regression model used to describe the battery dynamics during cranking is given in Equation (2). More specifically, Vo and Rb are determined (98) in Equation (2) using a least squares equation as follows:

$$V = V_0 + I*R_b, (I<0 \text{ for discharge}), \quad (2)$$

wherein equation (2) uses extracted values V and I to estimate an intercept voltage $V_0$ and the slope Rb, wherein $V_0$ is the battery voltage when the battery current is equal to zero and Rb is battery internal resistance. The voltage loss estimation module 34 next operates to read a battery open-circuit-voltage, $V_{ocv}$ (100) from either the battery voltage sensor 30A or the on-board memory 36 in the form of calibration data. Finally, the battery voltage loss module 34 determines voltage loss during cranking (102) as follows in Equation (3):

$$V_{loss} = V_{ocv} - V_0. \quad (3)$$

Referring now to FIG. 2, to determine the battery SOH, a predefined threshold of voltage loss during cranking, $\overline{V}_{loss}$, is determined from a look up table (104). $\overline{V}_{loss}$ may be determined (104) by using a calibrated two-dimensional look-up table associating battery temperature and battery SOC with battery voltage loss during cranking, wherein the parameters of battery temperature and battery state-of-charge are obtained during collection process (54). In one embodiment in accordance with the disclosure, the battery SOC can be determined using open-circuit-voltage. In one embodiment in accordance with the disclosure the threshold $\overline{V}_{loss}=2$.

Next, the battery SOH may be determined by comparing the estimated voltage loss, $V_{loss}$, to the predefined threshold of $\overline{V}_{loss}$, (106). The comparison (106) determines if the estimated voltage loss, $V_{loss}$, exceeds the threshold value of $\overline{V}_{loss}$. If the estimated voltage loss exceeds the threshold of the voltage loss (110), a warning message indicating a bad battery is generated (112). Otherwise, if the estimated voltage loss does not exceed the threshold of the voltage loss (114), a battery SOH index is generated (122) by using Equation 4:

$$SOH = \frac{V_{loss} - \overline{V}_{loss}}{V_{fresh} - \overline{V}_{loss}} * 100\%, \quad (4)$$

wherein $\overline{V}_{loss}$ is the voltage loss threshold, and $V_{fresh}$ is a nominal voltage loss value for fresh and good batteries. When SOH <0, SOH is set to 0% and when SOH >1, the SOH is set to 100%. The battery SOH index characterizes the battery remaining useful life (RUL) (116).

Finally the battery SOH signal is output (118) from the battery SOH monitoring system 20 to notify a user of the battery's SOH. In one embodiment in accordance with the disclosure, the battery SOH signal is output (118) to an indicator display.

Figure 8:
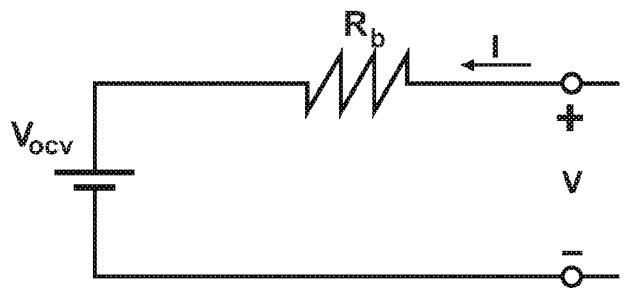
FIG. 8 is diagram illustrating a known battery model which does not take into account voltage loss during cranking in accordance with the present disclosure.
Figure 9:
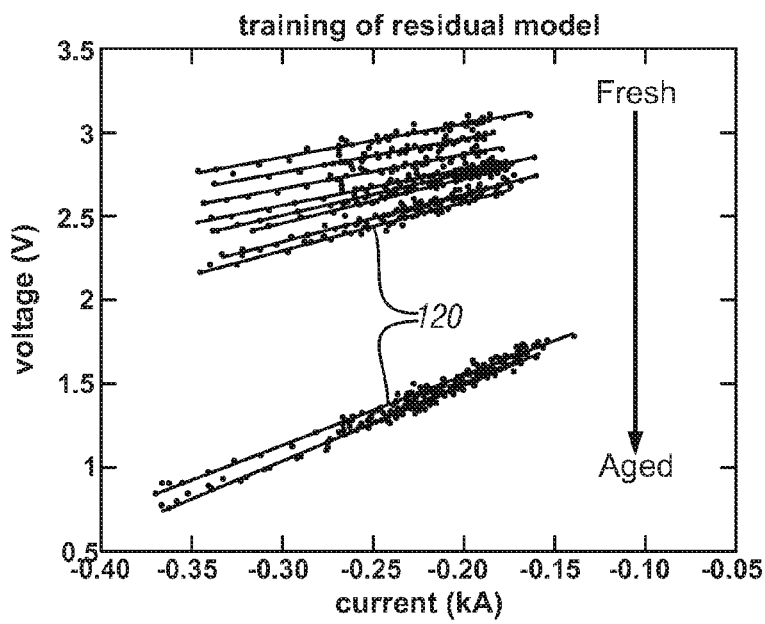
FIG. 9 illustrates cranking current and voltage at high state-of-charge and room temperature from a battery aged from fresh to dead through accelerated aging cycling in accordance with the present disclosure.

FIG. 8 is a graphical illustration of a widely-used battery model that does not take into account voltage loss during cranking. FIG. 9 illustrates several sets of cranking data 120 collected at approximately the same SOC from a battery which was aged from fresh to dead through accelerated cycling. The fitting line obtained from a linear regression of each data set is also shown. As can be seen, the intercept voltage decreases as a result of battery aging, which cannot be modeled by the conventional model of FIG. 8. In contrast, this behavior is well captured by the battery model 92, illustrated in FIG. 6, which incorporates a voltage loss component modeled as a function of battery age.

Figure 10:
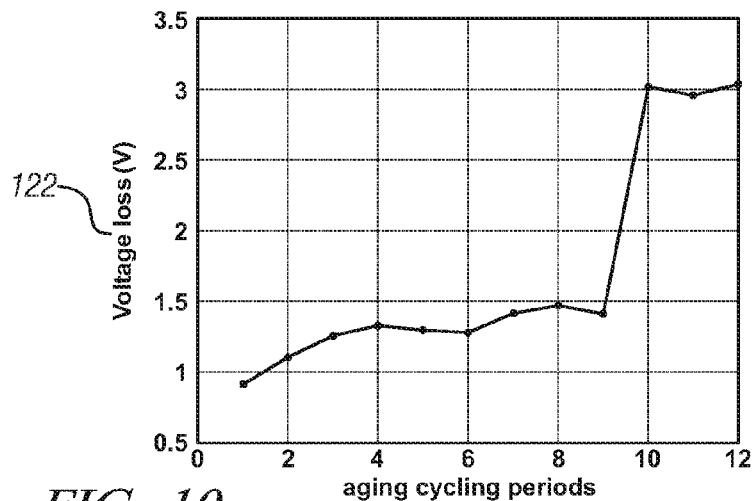
FIG. 10 illustrates a trend of voltage loss with respect to battery aging in accordance with the present disclosure.

FIG. 10 is a graphical illustration of voltage loss results determined using the battery voltage loss estimation module 34. As can be clearly seen in FIG. 10, wherein the battery voltage loss defines the y-axis 122 and the number of aging cycle periods define the x-axis 124, the value of voltage loss increases as the age of the battery increases, as indicated by plot line 126.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. A state-of-health monitoring and prognosis method for a battery comprising:
    monitoring battery terminal voltage and current;
    extracting a portion of said battery terminal voltage and current corresponding to an engine cranking event;
    determining an intercept voltage ($V_0$) based on the extracted portion of said battery terminal voltage and current signals corresponding to an engine cranking event, wherein the intercept voltage is the battery voltage when the battery current is equal to zero;
    obtaining a battery open-circuit-voltage ($V_{ocv}$) before the engine cranking event;
    estimating a battery voltage loss ($V_{loss}$) that occurs during said engine cranking event based on subtracting the battery open-circuit-voltage ($V_{ocv}$) from the intercept voltage ($V_0$) and
    comparing the estimated battery voltage loss ($V_{loss}$) with a predetermined voltage loss threshold ($\overline{V}_{loss}$) to determine battery state-of-health.

2. The method of claim 1, further comprising:
    modeling the battery as an equivalent circuit including an internal battery resistance (Rb), a current flowing through the battery (I), a battery terminal voltage (V), and battery voltage loss ($V_{loss}$) in series with a battery open-circuit-voltage ($V_{ocv}$), wherein the equivalent circuit is expressed as $V=V_{ocv}-V_{loss}+I*R_b$ for discharge currents.

3. The method of claim 1, further comprising:
    forming a linear regression model from the extracted portion of the battery terminal voltage and current signals associated with an engine cranking event, wherein the linear regression model defines battery dynamics during engine cranking; and
    determining the intercept voltage ($V_0$) and an internal battery resistance parameter ($R_b$) from the linear regression model.

4. The method of claim 1, wherein obtaining a battery open-circuit-voltage ($V_{ocv}$) before the engine cranking event comprises measuring battery open-circuit-voltage ($V_{ocv}$).

5. The method of claim 1, wherein obtaining a battery open-circuit-voltage ($V_{ocv}$) before the engine cranking event comprises reading a stored open-circuit-voltage ($V_{ocv}$) from a memory device.

6. The method of claim 1, wherein extracting a portion of said battery terminal voltage and current corresponding to an engine cranking event comprises:
    extracting the portion of said battery terminal voltage and current within a predefined time interval beginning at a first instant T1 and ending at a second instant T2 wherein the first instant T1 corresponds to an initial voltage drop due to starter engagement and the second instant T2 corresponds to a first occurrence of current crossing a predefined threshold subsequent to the first instant T1.

7. The method of 6, wherein the predefined threshold is substantially −100 Amps.

8. The method of claim 1, wherein extracting a portion of said battery terminal voltage and current corresponding to an engine cranking event comprises:
    extracting a portion of said battery terminal voltage and current that falls within a predefined range of current subsequent to a predetermined initial battery voltage drop due to initial engine cranking.

9. The method of claim 8, wherein the predefined range of current comprises a range of between about −300 Amps and about −100 Amps.

10. The method of claim 1, further comprising:
    collecting data associated with battery temperature and state-of-charge occurring prior to an engine cranking event until an engine cranking event occurs; and
    determining said predetermined voltage loss threshold ($\overline{V}_{loss}$) based on battery temperature and state-of-charge with voltage loss occurring during cranking.

11. The method of claim 1, further comprising:
    determining a battery state-of-health index based on the estimated battery voltage loss ($V_{loss}$).

12. The method of claim 11, wherein determining a battery state-of-health index comprises:
    generating a battery state-of-health index if the estimated battery voltage loss ($V_{loss}$) does not exceed said predetermined voltage loss threshold ($\overline{V}_{loss}$), wherein the battery state-of-health index is defined as $$\frac{V_{loss} - \overline{V}_{loss}}{V_{fresh} - \overline{V}_{loss}} * 100\%,$$

wherein $V_{fresh}$ is a nominal residual value for good batteries.

13. The method of claim 11, wherein comparing the estimated battery voltage loss ($V_{loss}$) with said predetermined voltage loss threshold ($\overline{V}_{loss}$) to determine battery state-of-health comprises:
    generating a warning message indicating a bad battery if the estimated battery voltage loss ($V_{loss}$) exceeds the predetermined voltage loss threshold ($\overline{V}_{loss}$).

14. The method of claim 1, further comprising:
    providing a battery state-of-health signal to notify a user of the battery state-of-health.

15. A state-of-health monitoring and prognosis system for a vehicular battery used in an engine starting application, comprising:
    a signal preprocessing module for receiving a plurality of inputs from a plurality of sensors that sense a plurality of battery parameters, wherein the signal preprocessing module determines an intercept voltage signal based on extracting battery current and voltage signals corresponding to an engine cranking event and obtains a measure of battery open-circuit-voltage signal before the engine cranking event;
    a voltage loss estimation module providing a voltage loss signal corresponding to battery voltage loss that occurs during engine cranking events based on subtracting the measure of battery open-circuit-voltage from the intercept voltage signal; and
    a state-of-health evaluation module providing a battery state-of-health signal based on said voltage loss output signal.

16. The state-of-health monitoring and prognosis system as claimed in claim 15, wherein said state-of-health evaluation module compares said voltage loss signal to a predetermined voltage loss threshold to determine said battery state-of-health.

17. The state-of-health monitoring and prognosis system as claimed in claim 15, wherein said voltage loss estimation module includes an equivalent circuit model of the battery including an internal battery resistance ($R_b$), a current flowing through the battery (I), a battery terminal voltage (V), and battery voltage loss ($V_{loss}$) in series with a battery open-circuit-voltage ($V_{ocv}$), wherein the equivalent circuit is expressed as $V=V_{ocv}-V_{loss}+I*R_b$ for discharge currents.

18. The state-of-health monitoring and prognosis system as claimed in claim 15, wherein said signal preprocessing module extracts a portion of battery terminal voltage and current that falls within a predefined range of current subsequent to a predetermined initial battery voltage drop at the inception of the engine cranking event.

* * * * *